United States Patent [19]

Latham, II

[11] Patent Number: 5,519,265
[45] Date of Patent: May 21, 1996

[54] ADAPTIVE RC PRODUCT CONTROL IN AN ANALOG-SIGNAL-MANIPULATING CIRCUIT

[76] Inventor: Paul W. Latham, II, 30 Wheelwright Dr., Lee, N.H. 13824

[21] Appl. No.: 65,790

[22] Filed: May 24, 1993

[51] Int. Cl.$^6$ ........................................... H03F 1/30
[52] U.S. Cl. ........................ 327/513; 327/101; 327/105
[58] Field of Search ........................... 328/14, 60, 129.1, 328/127; 307/491, 310, 271, 490

[56] References Cited

U.S. PATENT DOCUMENTS

| | | | |
|---|---|---|---|
| 4,446,438 | 5/1984 | Chang et al. | 328/127 |
| 5,245,262 | 9/1993 | Moody et al. | 318/560 |
| 5,258,760 | 11/1993 | Moody et al. | 341/166 |
| 5,278,478 | 1/1994 | Moody et al. | 318/560 |

*Primary Examiner*—William L. Sikes
*Assistant Examiner*—James Dudek

[57] ABSTRACT

An integrated circuit includes an analog-signal manipulating circuit (ASMC) such as a filter having a transfer function with a frequency response that is determined by at least one RC product. The integrated circuit also includes separately an RC oscillator. The frequency-response-determining RC products of an RC component pair in the filter and an oscillator frequency determining RC component pair in the RC oscillator are digitally programmable by an external microprocessor. The microprocessor holds the frequency of the RC oscillator fixed relative to its own crystal controlled oscillator by adjusting the programmable RC component pair of the RC oscillator. The same adjusting digital signal from the microprocessor is simultaneously applied to the programmable RC component pair(s) of the ASMC, which has the effect of stabilizing all RC component pairs and thus the ASMC frequency response. The capacitors of each RC component pair have binary-control-signal lines mutually parallel connected to each other. The microprocessor senses the frequency of the oscillator and by sending the appropriate binary control signal to the paralleled control lines to adjust the frequency of the RC oscillator to a predetermined value, the RC products of the other component pairs in the filter are adjusted to their respective predetermined values and maintained there during operation of the integrated filter circuit while subject to changes in temperature that would otherwise alter the RC products and therefore the transfer function of the ASMC.

3 Claims, 3 Drawing Sheets

ADAPTIVE RC PRODUCT CONTROL IN AN ANALOG-SIGNAL-MANIPULATING CIRCUIT

BACKGROUND

This invention relates to an integrated circuit (IC) analog-signal manipulating circuit (ASMC) having a frequency dependant transfer function wherein parameters that establish the frequency response of the transfer function are each attributable to the product of a resistance and a capacitance of the circuit, and more particularly pertains to such an ASMC wherein each of the frequency determining capacitors or resistors is a digitally programmable component that may be adjusted by a microprocessor to stabilize the corresponding RC product against changes with temperature.

A simple example of a digitally programmable analog-signal manipulating circuit is an integrator employing an integrator resistor and an integrator capacitor, wherein the transfer function of the integrator, with the Laplace frequency variable S, is 1/RCS.

Both the resistance R and the capacitance C change value as a function of temperature in a manner and to a degree depending mainly upon the materials of which the corresponding resistor body and capacitor dielectric are made. Thus, even with the most temperature stable resistors and capacitors the change in an RC product with temperature causes in many analog circuits an unwelcome change in the frequency response.

Furthermore, it is often difficult or impossible to build circuits with RC products that have a suitably predictable value or even a predictable temperature coefficient of RC product, especially for meeting specifications for stable circuit frequency responses over a broad range of operating temperatures.

It is therefore an object of this invention to provide an integrated analog signal manipulating circuit controllable by a microprocessor to have a temperature stable frequency response.

It is a further object of this invention to provide such a controllable integrated analog signal manipulating circuit that in effect has a uniformly predictable frequency response from chip to chip in spite of inevitable chip to chip RC-product differences.

SUMMARY

An integrated circuit includes an analog signal manipulating circuit (ASMC) with an ASMC analog input and an ASMC analog output. The ASMC has a transfer function that is the ratio of the analog signals appearing at the analog output and the analog input, respectively. The ASMC further has a plurality of timing component pairs, each of said component pairs composed of a capacitor and a resistor, wherein one of the capacitor and resistor is digitally programmable.

When in each of the component pairs the capacitor is the programmable component, it is constructed of a plurality of elemental capacitors and a plurality of digitally controllable switches for accepting digital control signals capable of adjusting the capacitance of the programmable-capacitor.

The integrated circuit also includes an RC oscillator employing one of the component pairs for producing a signal having a frequency that is a function of the RC product of the oscillator component pair. The others of the component pairs are connected between the ASMC input and the ASMC output for determining the critical time/frequency characteristic of said ASMC as reflected in said ASMC transfer function.

The component-pair resistors are made simultaneously by the same process steps, and the component-pair capacitors are made simultaneously by the same process steps so that, in operation, when an appropriate digital control signal is applied simultaneously to all of the programmable capacitors or programmable resistors, including that of the oscillator, to establish the RC oscillator frequency at a predetermined value, the ratio of RC-product of each one of the other component pairs to the RC-product of the oscillator component pair may be made an essentially predictable ratio value through ASMC manufacture, and that same ratio value may be maintained during operation over a wide range of environmental conditions that tend to shift component pair capacitances and resistances.

This invention recognizes that the ratios of any two capacitors formed simultaneously in an integrated circuit is essentially only a function of the predetermined areas of the two capacitors and that the ratios of capacitor areas is in fact highly controllable in integrated circuit manufacture. The same is true of the simultaneously formed integrated circuit resistors. Thus in an ASMC of this invention the ratios of capacitances of any two of the programmable capacitors of the same construction and of the same binary-control order is predictable in manufacture and is unchanged in operation over a wide range of operating environment such as temperature.

It therefore follows that when an appropriate digital control signal is applied simultaneously to all of the programmable-capacitor means including that of the oscillator to establish the oscillator frequency at a predetermined value, the ratio of RC-product of the oscillator to every other of the RC-products is an essentially predictable value after integrated circuit manufacture; and during operation over a wide range of environmental conditions that tend to shift component pair capacitances and resistances, all of the RC-products of the ASMC are held fixed by application of the simultaneously applied digital control signal that keeps the frequency of the oscillator invariant.

DESCRIPTION OF THE PREFERRED EMBODIMENTS

Figure 1:
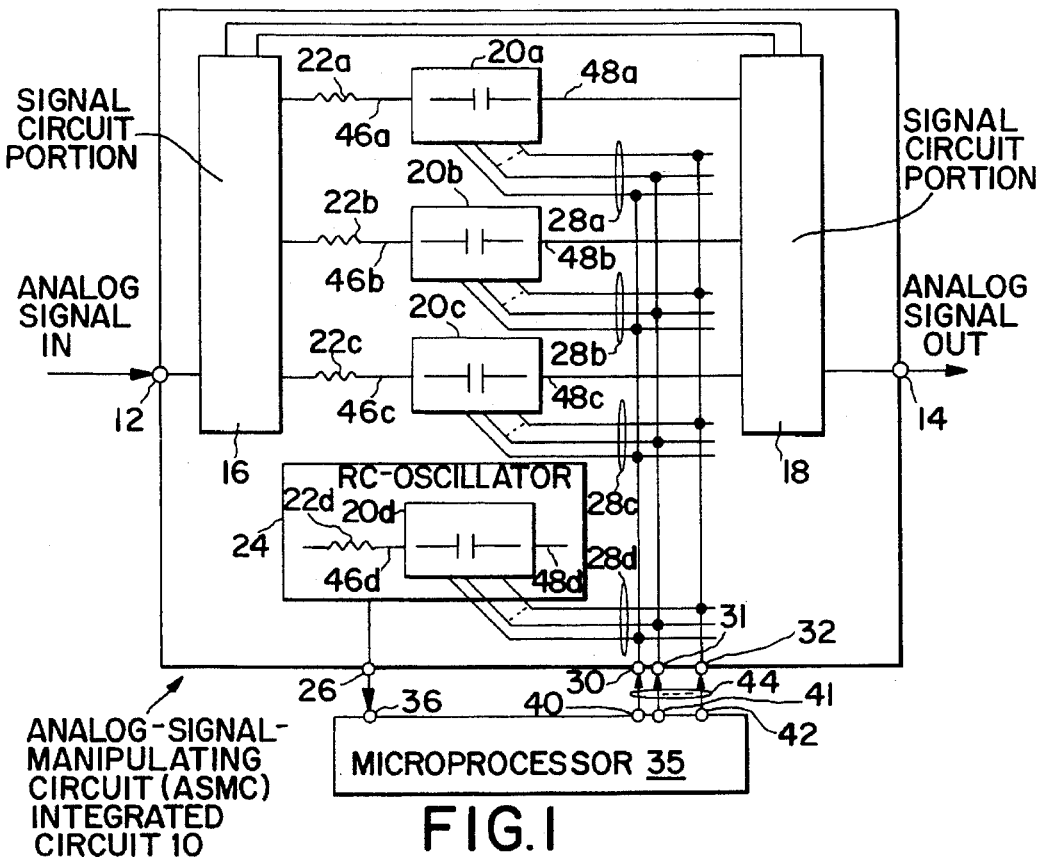
FIG. 1 shows an analog signal manipulating circuit (ASMC) including an independent RC oscillator formed in an integrated circuit chip that is connected to an external ASMC-controlling microprocessor.

The analog signal manipulating circuit (ASMC) of the integrated circuit 10 shown in FIG. 1 has an analog signal input 12 and an analog signal output 14. The analog signal handling portion of this circuit is connected between input 12 and output 14 and includes a signal circuit portion 16, a signal circuit portion 18 and a plurality of component pairs.

Each of the component pairs consists of a digitally programmable capacitor (i.e. 20a, 20b and 20c) and a resistor (i.e. 22a, 22b and 22c). The two circuit portions 16 and 18 and the component pairs (e.g. 20a and 20a) are mutually interconnected to form the analog signal handling portion of the integrated circuit 10.

The integrated circuit 10, having an output 26, further includes an RC timed oscillator 24 that includes another component pair consisting of a digitally programmable capacitor 20d and a resistor 22d. The RC product (in ohm farads) of the component pair 20d and 22d determines the frequency of oscillation of oscillator 24 and thus the frequency of the oscillator output signal appearing at the oscillator output 26.

Each of the digitally programmable capacitors 20a, 20b, 20c and 20d has a group of digital control lines 28a, 28b, 28c and 28d, respectively, that are connected mutually in parallel to each other. The control lines 28a, 28b, 28c and 28d are further connected to the integrated circuit group of digital control inputs 30, 31 and 32.

Each of the digitally programmable capacitors 20a, 20b, 20c and 20d has one capacitor lead 46a, 46b, 46c and 46d, respectively, and another capacitor lead 48a, 48b, 48c and 48d, respectively. At any instant, for example, the capacitance of the digitally programmable capacitor 20a appears across its capacitor leads 46a and 48a.

An external microprocessor 35 has an input terminal 36 connected to integrated circuit oscillator output 26, and a group of digital-control output terminals 40, 41 and 42 that are connected, via a group of conductors 44, to the integrated circuit digital control inputs 30. 31 and 32 respectively.

The microprocessor 35 includes a highly stable crystal controllable oscillator and a sequential logic circuit that adjusts the frequency of the RC-oscillator (24) to track that of the stable crystal oscillator and thereby adjusts to stabilize the RC-products of all of the ASMC component pairs.

Figure 2:
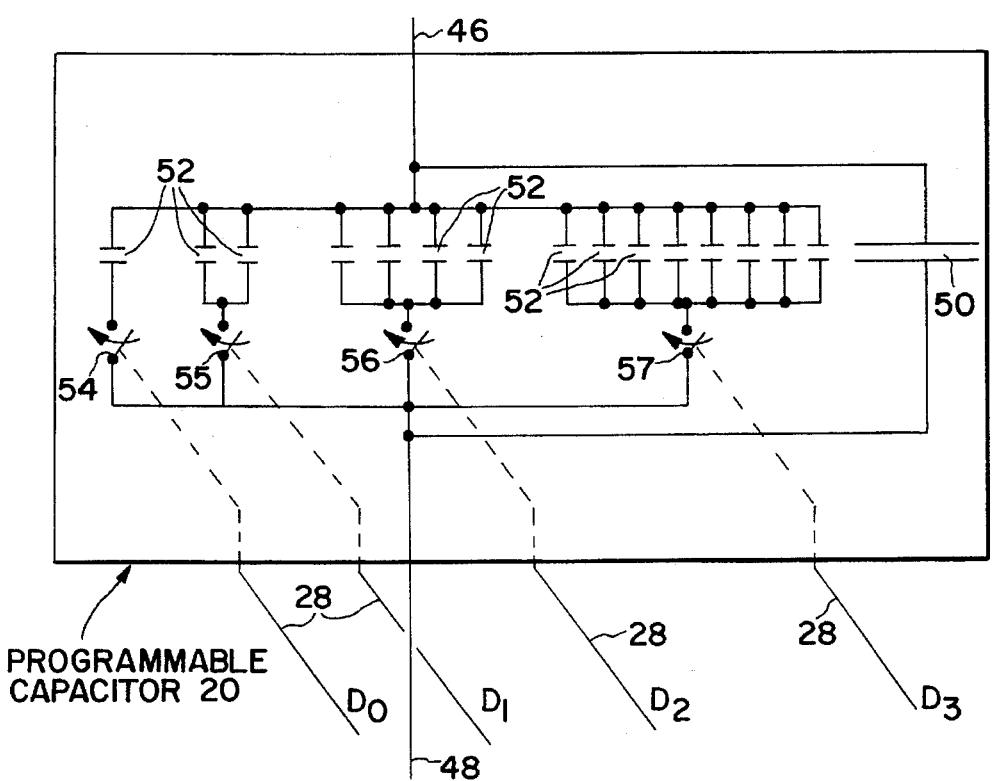
FIG. 2 shows the circuit of a digitally programmable capacitor employed in the ASMC of FIG. 1.

The digitally programmable capacitor 20 of FIG. 2, is made up of a large fixed capacitor 50 of capacitance $C_F$, and is connected directly across the two leads 46 and 48 of programmable capacitor 20. The fifteen relatively much smaller elemental capacitors 52 have the same small capacitance value. The programmable capacitor 20 is binarily weighted. All of the capacitors 52 have the same small capacitance value, C, and they are connected in binary groups of 1, 2, 4, etc. Electrically programmable switches 54, 55, 56 and 57 determine which groups of capacitors 52 contribute to the capacitance $C_A$ of the array of elemental capacitors 52 as measured between terminals 46 and 48 without large capacitor 50, and $C_A$=(D0+2D1+4D2+8D3)C.

More generally $C_A$=NC, wherein N is the decimal number corresponding to the digital programming signal that sets the switches 54 through 57. Here, the number of digital control lines 28 and the number of programming bits, n, is just 4 whereas a greater number of bits will usually be preferred. N can be any integer between 0 and $2^{n-1}$, so for n=4, N can be any integer between 0 and 15.

The total programmable-capacitor capacitance is therefore $C_T$=$C_A$+$C_F$=(D0+2D1+4D2+8D3)C+$C_F$ as seen across capacitor leads 46 and 48, so that when for example only switches 54 and 57 are closed the binary values D0, D1, D2 and D3 of the four switches are respectively 1, 0, 0, 1 leading to $C_A$=(1·1+0·2+0·4+1·8)=9C and if large capacitance $C_F$=100C then $C_T$=$C_F$+$C_A$=9C+100C =109C.

Figure 3:
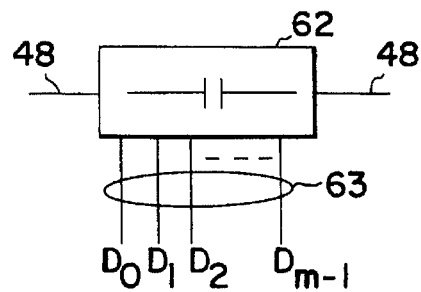
FIG. 3 shows a symbol for the digitally programmable capacitor of FIG. 2, which symbol is used in FIGS. 1 and 4.

The programmable capacitor 20 of FIG. 2 may be more generally represented by the symbol 62 of FIG. 3, has the value $C_T$=$C_A$+$C_F$, and has group 63 of n digital programming control lines 28.

Figure 4:
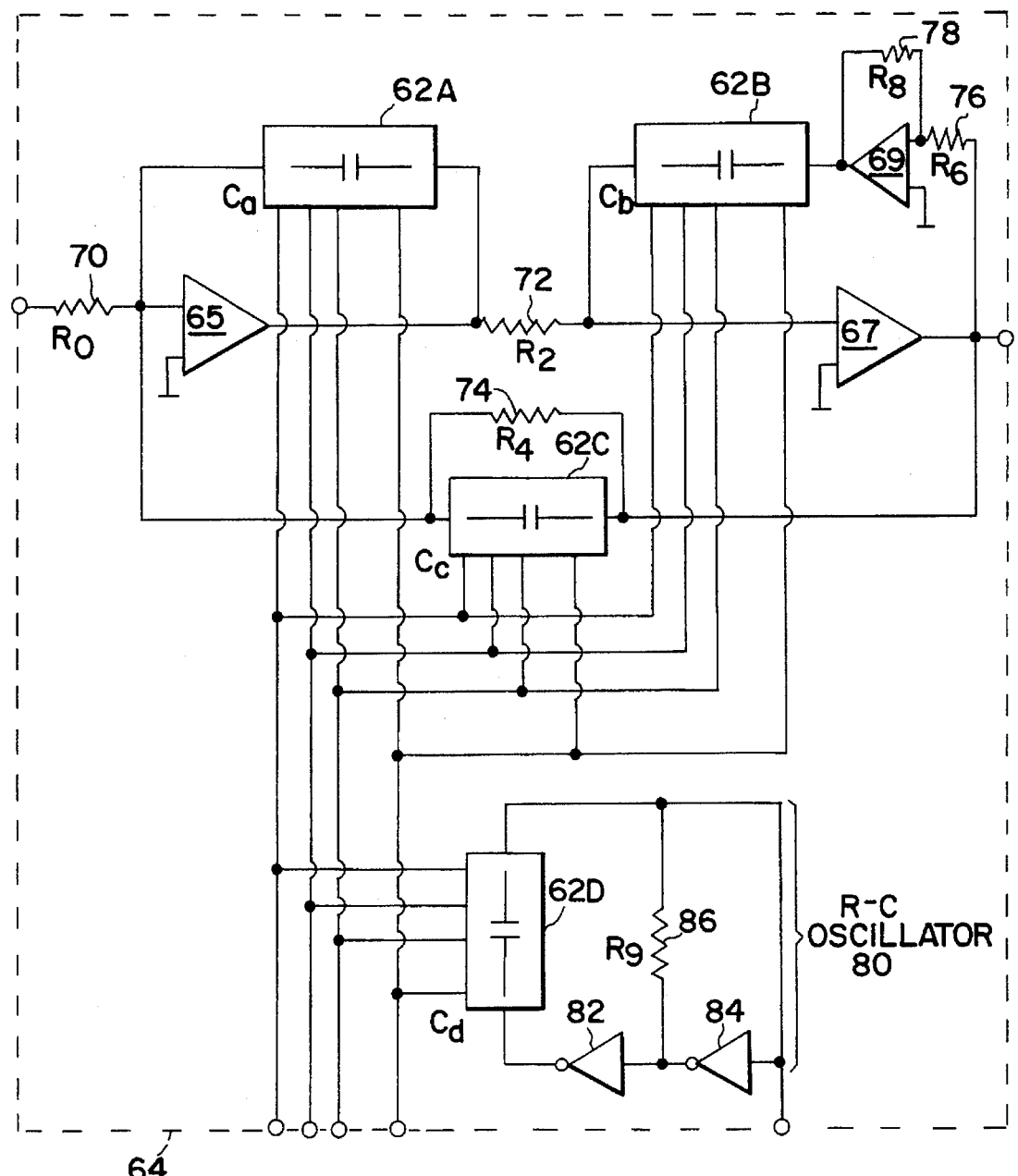
FIG. 4 shows a circuit diagram for an ASMC of this invention.

Referring now to FIG. 4, an integrated analog signal manipulating circuit (ASMC) 64 includes an analog signal filter that has three operational amplifiers 65, 67 and 69; three digitally programmable capacitors 62A, 62B and 62C; and five resistors 70, 72, 74, 76 and 78. Integrated circuit 64 also has an RC oscillator 80 including two inverters 82 and 84; a digitally programmable capacitor 62D; and a resistor 86.

The plurality of programmable capacitor means each exhibit a capacitance that preferably changes in a mutually identical manner as a function of digital-control-signal steps applied simultaneously to all of them, so that the ratio of the RC product of any one of the programmable capacitor means to the RC product of any other of the programmable capacitor means always remains fixed for any digital control signal, rather than changing as a function of digital control signal in some other predetermined manner. This may be accomplished, for example, whereby the programmable capacitors have the identical circuit diagram, e.g. the circuit diagram of FIG. 2, the elemental capacitors 52 are all of the same area and capacitance, and the ratio of the sizes and capacitances of an elemental capacitor 52 and the capacitor 50 is the same for all programmable capacitors.

Figure 5:
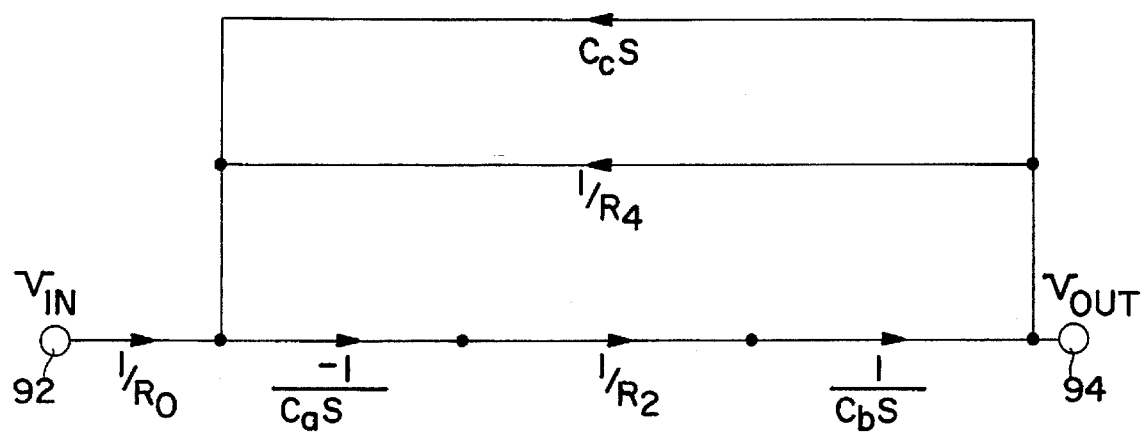
FIG. 5 shows a Mason diagram corresponding to the circuit of FIG. 4.

This ASMC filter has an ASMC input 92 and an ASMC output 94 and its transfer function is generated from inspection of the Mason diagram of FIG. 5.

$$\frac{V_{out}}{V_{in}} = \frac{\frac{1}{R_0 R_2 C_a C_b S^2}}{1 + \frac{1}{R_2 C_a C_b S^2} \cdot \frac{1}{R_4} + C_c S}$$

$$= \frac{\frac{1}{R_0 R_2 C_a C_b}}{S^2 + \frac{C_c}{R_2 C_a C_b} S + \frac{1}{R_2 R_4 C_a C_b}}.$$

The transfer function is presented in a form in which the role of RC product values in determining frequency response are readily apparent.

The integrated circuit ASMC chip 10 of FIG. 1 may include the microprocessor itself, with the exception of the crystal, especially in the case that the microprocessor's only assigned role is the simple one of providing the digital control signal that stabilizes the RC element pairs. In that simple role the microprocessor would be more likely to be just a sequential logic circuit with an external frequency reference.

It is preferred that each of the digital-signal programmable capacitor means has a group of n digital-signal input control lines for accepting a binary control signal of nth order, the groups (28a, 28b, 28c and 28d shown in FIG. 1) of digital-signal control lines of the programmable capacitor means all being connected together in parallel, so that a digital signal applied to one of the control-line groups is simultaneously applied to all of the programmable capacitors.

I claim:

1. An integrated circuit comprising:

a) an analog signal manipulating circuit (ASMC), said ASMC having an analog input and analog output, said ASMC having a transfer function that is the ratio of the analog signals appearing at said analog output and said analog input, respectively;

b) a plurality of timing component pairs, each of said component pairs comprised of a capacitor and a resistor, one of said component pairs being digitally programmable;

c) an RC oscillator means comprised of one of said component pairs for producing a signal having a frequency that is a function of the RC product in ohm-farads of said one component pair, each of the others of said component pairs being connected between said ASMC input and said ASMC output for determining a critical time characteristic of said ASMC as reflected in said ASMC transfer function;

said component-pair resistors having been simultaneously made by mutually the same process steps, and said component-pair capacitors having been simultaneously made by mutually the same process steps, each of said digitally programmable components having a group of n digital-signal input control lines for accepting a binary control signal of nth order, the groups of digital-signal control lines of said programmable components all being connected together in parallel, so that a digital signal applied to one of said control-line groups is simultaneously applied to all of said programmable-component control line groups.

2. An integrated circuit comprising:

a) an analog signal manipulating circuit (ASMC), said ASMC having an analog input and analog output, said ASMC having a transfer function that is the ratio of the analog signals appearing at said analog output and said analog input, respectively;

b) a plurality of timing component pairs, each of said component pairs comprised of a digitally programmable capacitor and an ohmic resistor;

c) an RC oscillator means compressed of one of said component pairs for producing a signal having a frequency that is a function of the RC product in ohm-farads of said one component pair, each of the others of said component pairs being connected between said ASMC input and said ASMC output for determining a critical time characteristic of said ASMC as reflected in said ASMC transfer function;

said component-pair resistors have been simultaneously made by mutually the same process steps, and said component-pair capacitors having been simultaneously made by mutually the same process steps, each of said plurality of programmable capacitors exhibit a capacitance that changes in a mutually identical manner as a function of a simultaneously applied digital-control-signal in all of them and the ratio of the capacitances of any one to any other of said programmable capacitors remains constant for all digital control signals, each of said digitally programmable capacitors having a group of n digital-signal input control lines for accepting a binary control signal of nth order, the groups of digital-signal control lines of said programmable capacitors all being connected together in parallel, so that a digital signal applied to one of said control-line groups is simultaneously applied to all of said programmable-capacitor control line groups, so that a digital control signal may be applied simultaneously to all of said programmable-capacitors including that of said oscillator to establish and maintain the oscillator frequency at a predetermined value, resulting in holding constant the RC-products of every one of said others of said component pairs during operation over a wide range of environmental conditions that tend to shift component pair capacitances and resistance, 3. The integrated circuit of claim 1 and additionally a microprocessor means connected to said paralleled groups of digital signal control lines and to said oscillator for sensing the oscillator frequency and generating appropriate digital signals on said control lines for adjusting the capacitance value of said oscillator programmable capacitor to keep the oscillator frequency constant, and to simultaneously maintain the frequency response of said ASMC constant.

\* \* \* \* \*